(12) United States Patent
Wang et al.

(10) Patent No.: US 11,550,709 B2
(45) Date of Patent: Jan. 10, 2023

(54) MEMORY DEVICE AND WEAR LEVELING METHOD FOR THE SAME

(71) Applicant: MACRONIX INTERNATIONAL CO., LTD., Hsinchu (TW)

(72) Inventors: Wei-Chen Wang, Taipei (TW); Hung-Sheng Chang, Taipei (TW); Chien-Chung Ho, Chiayi County (TW); Yuan-Hao Chang, Taipei (TW); Tei-Wei Kuo, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 296 days.

(21) Appl. No.: 16/655,510

(22) Filed: Oct. 17, 2019

(65) Prior Publication Data
US 2020/0319998 A1    Oct. 8, 2020

Related U.S. Application Data

(60) Provisional application No. 62/828,495, filed on Apr. 3, 2019.

(51) Int. Cl.
| | |
|---|---|
| *G06F 12/02* | (2006.01) |
| *G06N 3/08* | (2006.01) |
| *G06N 3/10* | (2006.01) |
| *G11C 7/10* | (2006.01) |

(52) U.S. Cl.
CPC .......... *G06F 12/0246* (2013.01); *G06N 3/08* (2013.01); *G06N 3/10* (2013.01); *G11C 7/1096* (2013.01); *G06F 2212/1036* (2013.01); *G06F 2212/7211* (2013.01)

(58) Field of Classification Search
CPC ........ G06F 12/0246; G06F 2212/1036; G06N 3/08; G06N 3/10; G11C 7/1096
See application file for complete search history.

(56) References Cited

U.S. PATENT DOCUMENTS

| | | | | |
|---|---|---|---|---|
| 2015/0127892 | A1* | 5/2015 | Carannante | G06F 12/0246 711/103 |
| 2015/0268961 | A1* | 9/2015 | Zuraski | G06F 9/3804 712/207 |
| 2018/0315158 | A1* | 11/2018 | Nurvitadhi | G06F 9/3017 |

FOREIGN PATENT DOCUMENTS

CN      106875012 A    *    6/2017

* cited by examiner

*Primary Examiner* — Michelle T Bechtold
(74) *Attorney, Agent, or Firm* — McClure, Qualey & Rodack, LLP

(57) ABSTRACT

A memory device includes: a memory array used for implementing neural networks (NN); and a controller coupled to the memory array. The controller is configured for: in updating and writing unrewritable data into the memory array in a training phase, marching the unrewritable data into a buffer zone of the memory array; and in updating and writing rewritable data into the memory array in the training phase, marching the rewritable data by skipping the buffer zone.

14 Claims, 5 Drawing Sheets

MEMORY DEVICE AND WEAR LEVELING METHOD FOR THE SAME

This application claims the benefit of U.S. provisional application Ser. No. 62/828,495, filed Apr. 3, 2019, the subject matter of which is incorporated herein by reference.

TECHNICAL FIELD

The disclosure relates in general to a memory device and a wear leveling method for the same.

BACKGROUND

In recent years, neural networks (NN) or Artificial neural networks (ANN) become a popular solution in artificial intelligence area.

For example, in image recognition, ANN or NN might learn to identify images that contain cats by analyzing example images that have been manually labeled as "cat" and using the results to identify cats in other images. ANNs or NNs automatically generate identifying characteristics from the learning material that they process.

ANNs or NNs have been used on a variety of tasks, including image recognition, speech processing, computer vision, speech recognition, machine translation, social network filtering, playing board and video games and medical diagnosis. However, the growing model size of neural network especially in training phase becomes an issue. Data precision tolerance is also an important characteristic of neural networks.

Meanwhile, there are several issues when DRAMs are used as main memories for neural networks. The price of DRAM is high; DRAM confronts scaling difficulty; the memory density of DRAM is not large enough; and leakage power is another significant problem for DRAM.

As a result, phase-change memory (PCM) is proposed as an alternative main memory device for neural networks. Compared with DRAM, the price of PCM is low; PCM has not confronted scaling difficulty; the memory density of PCM is large; and PCM has no leakage power issue.

PCM is one kind of erasable computer storage media, having individually erasable segments, each of which can be put through a limited number of erase cycles before becoming unreliable. Wear leveling (also written as wear levelling) is a technique for prolonging the service life of erasable computer storage media. Wear leveling arranges data so that erasures and re-writes are distributed evenly across the erasable computer storage media.

In the erasable computer storage media, the major challenge falls on how to prevent the frequently updated data from wearing out their residing memory cells without excessively searching and moving data.

Implementation of an effective wear leveling algorithm may consume memory space, increase operating complexity, and cause system overhead and latency. Therefore, it is important to balance the trade-offs between low latency and effective wear leveling.

It is desirable to provide an effective wear leveling design that has low computational complexity and low latency, and that can be compatible with existing virtual addressing schemes used for memory management.

SUMMARY

According to one embodiment, provided is a memory device including: a memory array used for implementing neural networks (NN); and a controller coupled to the memory array. The controller is configured for: in updating and writing unrewritable data into the memory array in a training phase, marching the unrewritable data into a buffer zone of the memory array; and in updating and writing rewritable data into the memory array in the training phase, marching the rewritable data by skipping the buffer zone.

According to another embodiment, provided is a wear leveling method for a memory device, the memory device including a memory array for implementing neural networks (NN). The wear leveling method includes: in updating and writing unrewritable data into the memory array in a training phase, marching the unrewritable data into a buffer zone of the memory array; and in updating and writing rewritable data into the memory array in the training phase, marching the rewritable data by skipping the buffer zone.

Figure 1:
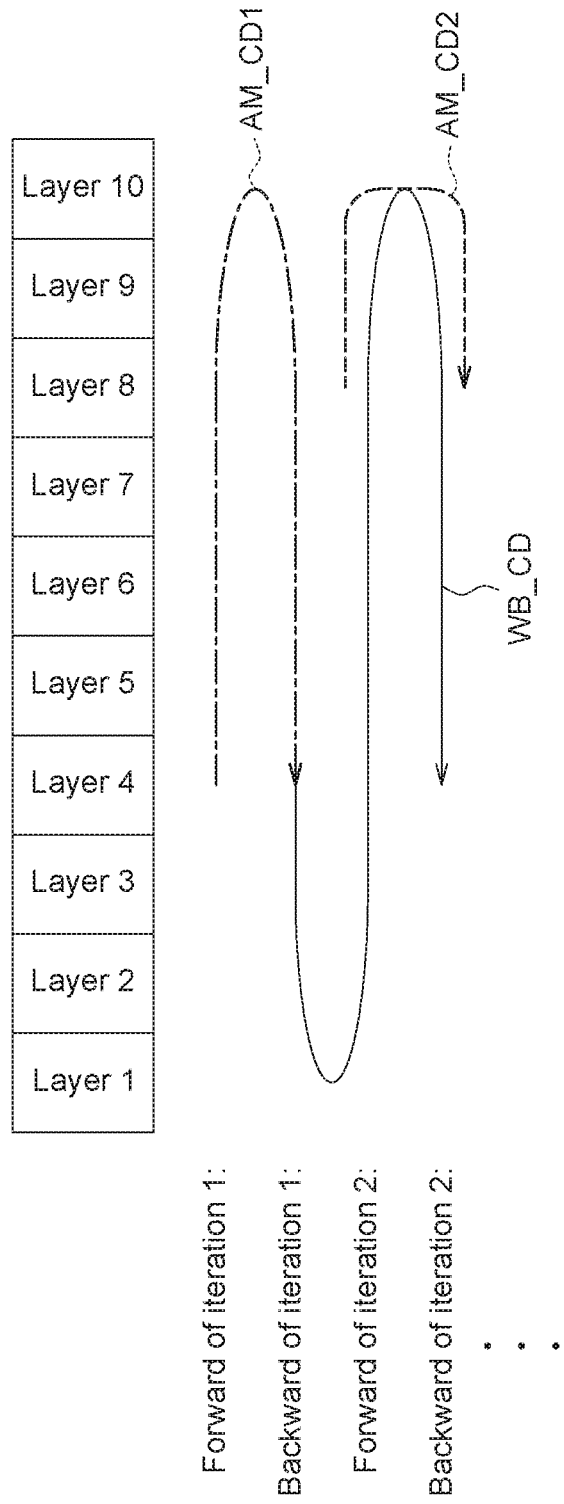
FIG. 1 shows a diagram for NN training.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a diagram for NN training. NN training needs a plurality of iterations each including a forward propagation and a backward propagation. As shown in FIG. 1, NNs have two types of data, for example, (1) activation maps (AM) or "input and intermediate data" or feature maps (FM); and (2) Weights and biases (WB). AMs and WBs have different diverse computation durations. AM in deeper layers have shorter computation durations. AM in shallower layers have longer computation durations. Weights and biases in all layers have the longest computation durations. The term "computation duration" means the time duration of the data of a layer needed to be maintained or in the valid state.

In FIG. 1, $AM\_CD1$ represents the computation duration (CD) of the AM of layer 4; $AM\_CD2$ represents the computation duration of the AM of layer 8 ($AM\_CD1$ is longer than $AM\_CD2$); and $WB\_CD$ represents the computation duration of the weight and biases (WB) of layer 8. The data relationship of activation maps is inner-iteration and the data relationship of weights and biases is outer-iteration. In the forward propagation of each iteration of each layer, sum of product operations are performed on the WB and the layer input to produce the activation maps of each layer. In the backward propagation of each iteration of each layer, the produced activation maps are used to update the weights and biases.

As shown in FIG. 1, AMs have to be maintained or in the valid state from the forward propagation of the current iteration to the backward propagation of the current iteration. Thus, during the backward propagation of the current iteration to the forward propagation of the next iteration, AMs do not need to be maintained. That is to say, during the backward propagation of the current iteration to the forward propagation of the next iteration, AMs are rewritable; while during the forward propagation of the current iteration to the backward propagation of the current iteration, AMs are unrewritable.

On the contrary, as shown in FIG. 1, WBs have to be maintained or in the valid state from the backward propagation of the current iteration to the backward propagation of the next iteration. That is to say, during the backward propagation of the current iteration to the backward propagation of the next iteration, WBs are unrewritable. In other words, during all iterations of the training phase, WBs are unrewritable.

Programming operations used for programming AMs and WBs include: reset operations, set operations. The set operations may have several kinds of enabled duration (or said program pulse time). The reset operations are used to reset the memory cells as logic 0. The set operations (no matter the length of the enabled duration) are used to set the memory cells as logic 1.

The reset operation has an enabled duration (or said program pulse time) of 1 unit time. In the embodiment of the application, there are several types of set operations having different enabled duration. For example, one type of the set operations may have an enabled duration of 1 unit time, while another type of the set operations may have an enabled duration of 2 or more unit time.

Figure 2:
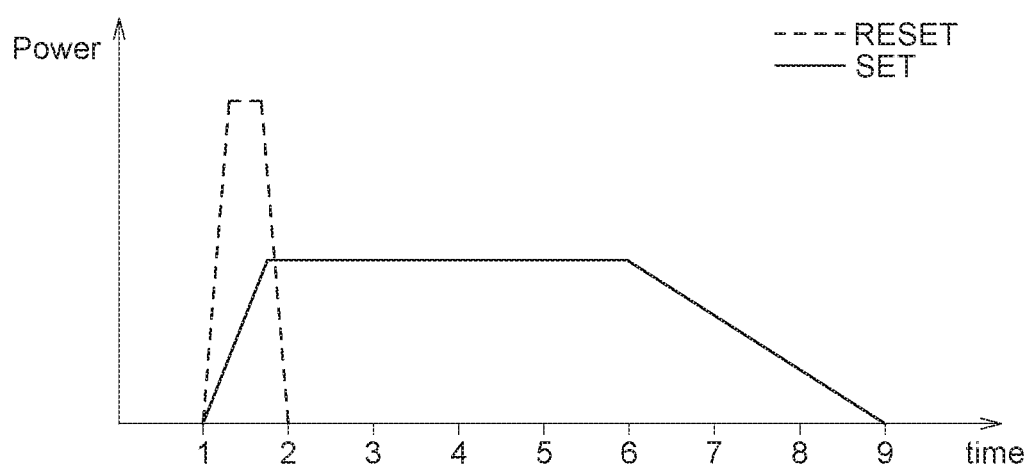
FIG. 2 shows programming operations according to one embodiment of the application.

The reset operations and the set operations may do harm to the memory cells of the memory device, depending on the power amplitude, the enabled duration and the execution frequency of the reset operations and the set operations. FIG. 2 shows programming operations according to one embodiment of the application. As shown in FIG. 2, if the reset operations or the set operations have higher power amplitude, the reset operations or the set operations do more harm to the memory cells. Also, if the reset operations or the set operations have longer enabled duration, the reset operations or the set operations do more harm to the memory cells. Of course, if the reset operations or the set operations are executed more frequently, the reset operations or the set operations do more harm to the memory cells.

In the following, four types of data, namely LSBs (Least Significant Bits) of the WBs (or said WBs LSBs), MSBs (Most Significant Bits) of the WBs (or said WBs MSBs), AMs of the shallow layers (or said the shallow layer AMs) and AMs of the deep layers (or said the deep layer AMs) are explained based on the data size, the computation duration and the data harm (i.e. the harm caused to the memory cells due to the set operations used for programming data). Programming operation performed on the four types of data cause different degrees of harm to the memory cells.

Thus, the set operation for programming the LSBs of the WBs is considered to do most harm to the memory cells due to the high execution frequency of the set operations for programming the LSBs of the WBs, and the LSBs of the WBs have the second longest computation duration and small data size. For example, the LSBs of the WBs have to be programmed or written into the memory cells in every iteration of the training phase. The LSBs of the WBs are considered as the most harmful data to the memory cells.

The set operation for programming the MSBs of the WBs is considered to do second most harm to the memory cells due to the long enabled duration of the set operations for programming the MSBs of the WBs, while the MSBs of the WBs have the longest computation duration and small data size. For example, the MSBs of the WBs are programmed or written only if the MSBs of the WBs are changed. The MSBs of the WBs are considered as the second most harmful data to the memory cells.

The set operation for programming the AMs of the shallow layers is considered to do third most harm to the memory cells due to the short enabled duration of the set operation for programming the AMs of the shallow layers, while the AMs of the shallow layers have the third longest computation duration and large data size. The AMs of the shallow layers are considered as the third most harmful data to the memory cells.

The set operation for programming the AMs of the deep layers is considered to do least harm to the memory cells due to the shorter enabled duration of the set operation for programming the AMs of the deep layers, while the AMs of the deep layers have the shortest computation duration and large data size. The AMs of the deep layers are considered as the least harmful data to the memory cells.

In one embodiment of the application, in order to prolong the service life of the erasable memory cells of the memory device, a marching-based wear leveling is disclosed. In the marching-based wear leveling of the embodiment of the application, all data stored in the memory cells are marched forwardly and iteratively. In each marching iteration, all data move forward with a minor step (i.e. size of the minimal data).

Further, as discussed above, AMs and WBs need to be read in the backward propagation of each iteration in the training phase. Also, WBs need to be updated in the backward propagation of each iteration while AMs do not need to be updated in the backward propagation of each iteration. It means that WBs cannot be overwritten during the training phase. Overwriting the WBs randomly might cause data error in backward propagation of each iteration in the training phase. On the other hand, AMs can be overwritten during the backward propagation of the current iteration to the forward propagation of the next iteration. Therefore, in one embodiment of the application, a buffer zone is reserved for the updated WBs. In other words, after the WBs are updated, the updated WBs are marched into the buffer zone while the AMs are not allowed to be written into the buffer zone for protecting the updated WBs.

Figure 3:
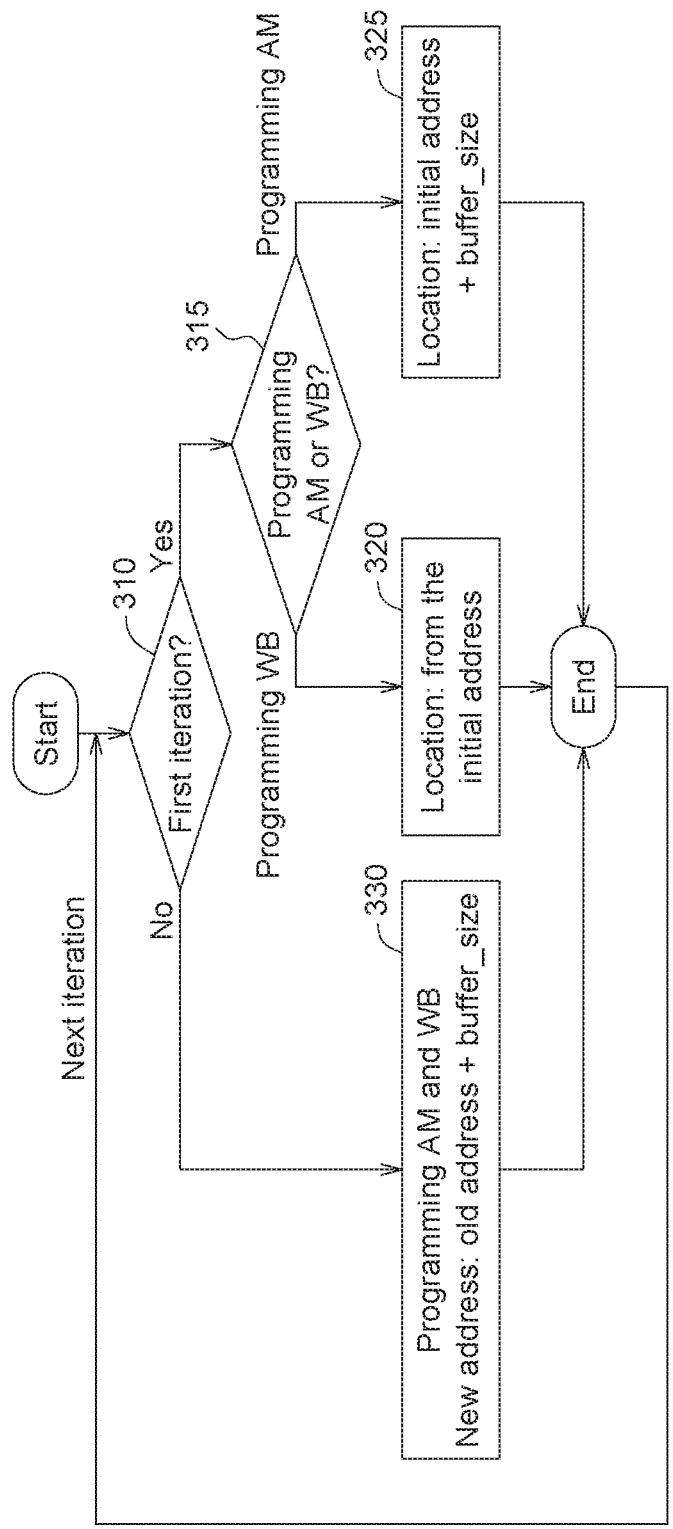
FIG. 3 shows a flow chart of a marching-based wear leveling method according to one embodiment of the application.

FIG. 3 shows a flow chart of the marching-based wear leveling method according to one embodiment of the application.

In step 310, it is determined whether the training phase is in the first iteration. If yes in step 310, then whether either WBs or AMs are programmed is determined in step 315. If WBs are programmed, then the WBs are programmed from the initial address in step 320. The initial address is address 0 for example but the application is not limited by this. If AMs are programmed, then the AMs are programmed into the address which is the summation of the initial address plus the buffer zone size in step 325. The buffer zone has a size of the minimal data (i.e. the size of the WBs). That is, in step 325, the buffer zone is reserved for writing the updated WBs.

If no in step 310, then the AMs or WBs are programmed from the new address (or the current target address) in step 330, wherein the new address (or the current target address) of the AMs or WBs are the summation of the old address (or the previous target address) of the AMs or WBs plus the buffer zone size. The new address (or the current target address) of the AMs or WBs refers to the address for writing the AMs or WBs in the current iteration while the old address (or the previous target address) of the AMs or WBs refers to the address for writing the AMs or WBs in the previous iteration.

After the AMs and/or the WBs of the current iteration are programmed (i.e. the step 320, 325 or 330 is executed), the next iteration is performed.

Figure 4:
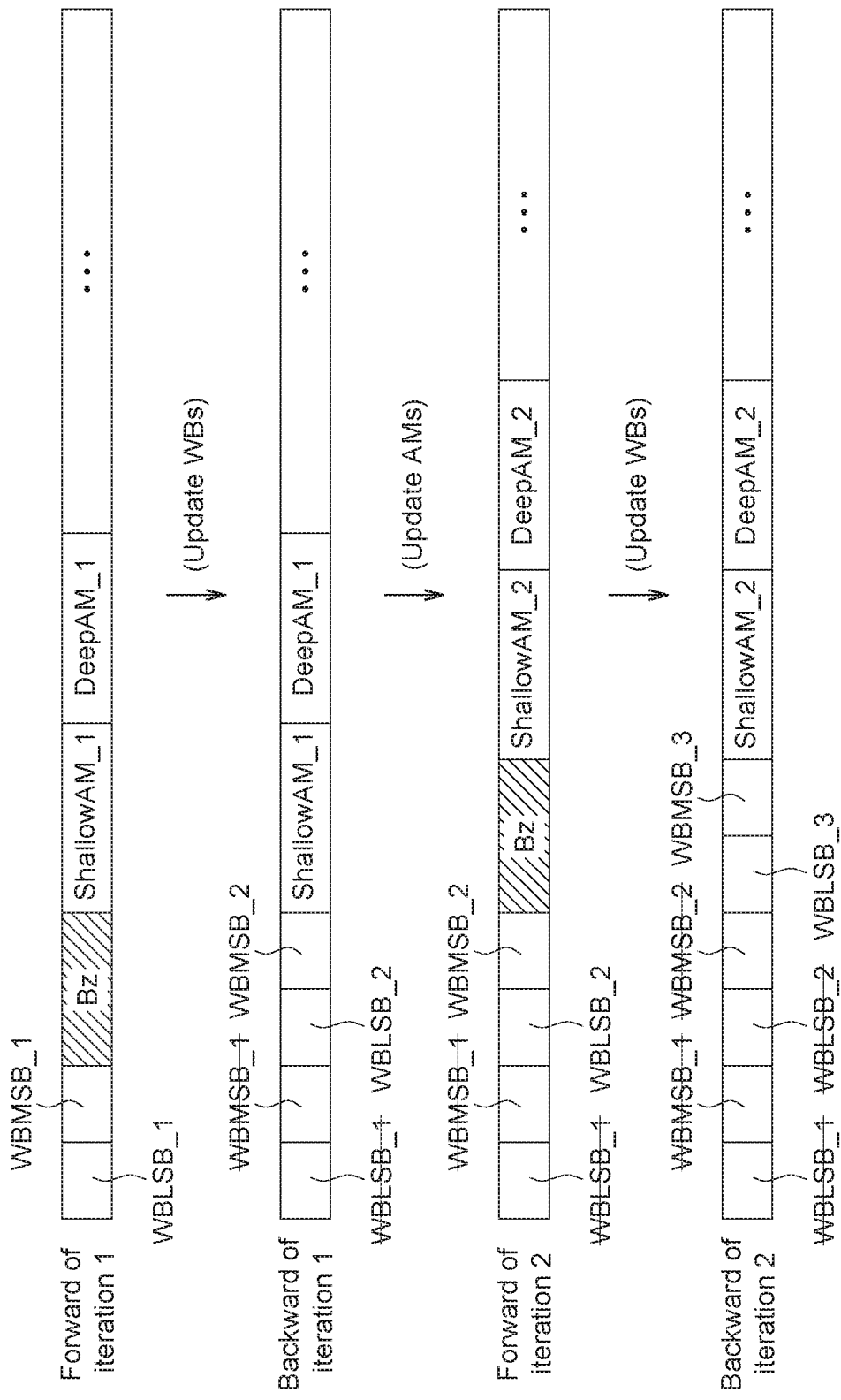
FIG. 4 shows marching-based wear leveling according to one embodiment of the application.

FIG. 4 shows marching-based wear leveling according to one embodiment of the application. In the forward propagation of the first iteration, the LSBs of the WBs WBLSB_1 and the MSBs of the WBs WBMSB_1 are written into the initial address (as shown in step 320 of FIG. 3) while the AMs in the shallow layers "ShallowAM_1" and the AMs in the deep layers "DeepAM_1" are written from the address which is the summation of the initial address plus the buffer zone size (as shown in step 325 of FIG. 3) (i.e. in the forward propagation, a buffer zone is reserved and write of the AMs skips the buffer zone). "WBLSB_i" refers to the i-th version of the LSBs of the WBs, wherein "i" is a natural number, and if data is moved or updated or changed, then "i" is increased. Similarly, "WBMSB_i" refers to the i-th version of the MSBs of the WBs; "ShallowAM_i" refers to the i-th version of the AMs in the shallow layers; and "DeepAM_i" refers to the i-th version of the AMs in the deep layers.

Although in FIG. 4, the LSBs of the WBs have an address smaller than the MSBs of the WBs, the application is not limited by this. In other possible embodiment of the application, the LSBs of the WBs may have an address larger than the MSBs of the WBs, which is still within the spirit and the scope of the application.

In the backward propagation of the first iteration, the WBs are updated and moved into the buffer zone BZ. In details, the LSBs of the WBs WBLSB_1 and the MSBs of the WBs WBMSB_1 are updated as the LSBs of the WBs WBLSB_2 and the MSBs of the WBs WBMSB_2 and marched (or said moved) into the buffer zone BZ (as shown in step 330 of FIG. 3). However, in the backward propagation of the first iteration, the AMs are kept unchanged.

In the forward propagation of the second iteration, the buffer zone is reserved again, and the AMs are updated and written into the new address of the AMs (the new address of the AMs in the second iteration is the summation of the old address of the AMs in the first iteration plus the buffer zone size). In details, the AMs ShallowAM_1 and DeepAM_1 are updated as the AMs ShallowAM_2 and DeepAM_2 and marched to the target address by skipping the buffer zone BZ (i.e. the AMs ShallowAM_2 and DeepAM_2 are prevented from writing into the buffer zone BZ).

Similarly, in the backward propagation of the second iteration, the WBs are updated and moved into the buffer zone BZ. In details, the LSBs of the WBs WBLSB_2 and the MSBs of the WBs WBMSB_2 are updated as the LSBs of the WBs WBLSB_3 and the MSBs of the WBs WBMSB_3 and marched into the buffer zone BZ. However, in the backward propagation of the second iteration, the AMs are kept unchanged.

The above steps are repeated until all iterations of the training phase are completed.

Figure 5:
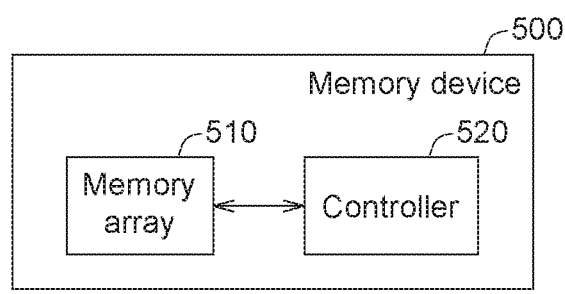
FIG. 5 shows a block diagram of a memory device according to one embodiment of the application.

FIG. 5 shows a block diagram of a memory device according to one embodiment of the application. As shown in FIG. 5, the memory device 500 includes a memory array 510 and a controller 520. The memory array 510 is used to implement the ANN or the NN. The controller 520 is coupled to the memory array 510. The controller 520 is configured to control programming operations performed on the memory array and to control the marching-based wear leveling, as described in the above embodiments of the application. In FIG. 5, the controller 520 is realized by internal circuits of the memory device 500, but the application is not limited by this. In other possible embodiments of the application, the controller may be implemented by an external controller, which is still within the scope and spirit of the application.

As described in the above embodiment of the application, data is marched with the smallest size of data (for example data size of WBs), and thus the embodiment of the application distributes cell harm equally. Therefore, good wear leveling effect is achieved in the above embodiment of the application.

Also, in the above embodiment of the application, a buffer zone is reserved in the forward propagation of each iteration of the training phase. The unrewritable data is marched into the buffer zone when the unrewritable data is updated (for example in the backward propagation of each iteration of the training phase). Thus, data overwriting on unrewritable data is avoided.

Embodiments of the application disclose a marching-based wear leveling to achieve endurance improvement and to avoid overwrite on unrewritable data when non-volatile memory is used as a low-cost and large-size main memory architecture for neural network.

Embodiments of the application may be applied to various non-volatile memories such as Phase Change memory (PCM), Resistive random-access memory (RRAM or ReRAM) or Magnetoresistive Random Access Memory (MRAM). Also, embodiments of the application may be applied to various applications (i.e. not limited to NN devices).

Also, embodiments of the application may be applied to memory type non-volatile memory devices or storage type non-volatile memory devices.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:
    a memory array used for implementing neural networks (NN); and
    a controller coupled to the memory array, the controller being configured for:
    in updating and writing unrewritable data into the memory array in a training phase of the neural networks, marching the unrewritable data into a buffer zone of the memory array, wherein the unrewritable data includes weights and biases which are not overwritten by other data during all iterations of the training phase of the neural networks; and in updating and writing rewritable data into the memory array in the training phase of the neural networks, marching the rewritable data by skipping the buffer zone.

2. The memory device according to claim 1, wherein the rewritable data includes activation maps.

3. The memory device according to claim 1, wherein the buffer zone has a size corresponding to data size of the unrewritable data.

4. The memory device according to claim 1, wherein in a first iteration of the training phase, the unrewritable data is written into an initial address; and the rewritable data is written into an address which is summation of the initial address plus a size of the buffer zone.

5. The memory device according to claim 4, wherein in a second or later iteration of the training phase, the unrewritable data is written into a first current target address which is summation of a first previous target address plus the size of the buffer zone, the first previous target address referring to an address which the unrewritable data is written in a previous iteration.

6. The memory device according to claim 5, wherein in a second or later iteration of the training phase, the rewritable data is written into a second current target address which is summation of a second previous target address plus the size of the buffer zone, the second previous target address referring to an address which the rewritable data is written in the previous iteration.

7. The memory device according to claim 1, wherein in forward propagation of each iteration of the training phase, the buffer zone is reserved.

8. A wear leveling method for a memory device, the memory device including a memory array for implementing neural networks (NN), the wear leveling method including:

in updating and writing unrewritable data into the memory array in a training phase of the neural networks, marching the unrewritable data into a buffer zone of the memory array, wherein the unrewritable data includes weights and biases which are not overwritten by other data during all iterations of the training phase of the neural networks; and in updating and writing rewritable data into the memory array in the training phase of the neural networks, marching the rewritable data by skipping the buffer zone.

9. The wear leveling method according to claim 8, wherein the rewritable data includes activation maps.

10. The wear leveling method according to claim 8, wherein the buffer zone has a size corresponding to data size of the unrewritable data.

11. The wear leveling method according to claim 8, wherein in a first iteration of the training phase, the unrewritable data is written into an initial address; and the rewritable data is written into an address which is summation of the initial address plus a size of the buffer zone.

12. The wear leveling method according to claim 11, wherein in a second or later iteration of the training phase, the unrewritable data is written into a first current target address which is summation of a first previous target address plus the size of the buffer zone, the first previous target address referring to an address which the unrewritable data is written in a previous iteration.

13. The wear leveling method according to claim 12, wherein in a second or later iteration of the training phase, the rewritable data is written into a second current target address which is summation of a second previous target address plus the size of the buffer zone, the second previous target address referring to an address which the rewritable data is written in the previous iteration.

14. The wear leveling method according to claim 8, wherein in forward propagation of each iteration of the training phase, the buffer zone is reserved.

* * * * *